US007122944B2

(12) United States Patent
Grimshaw

(10) Patent No.: US 7,122,944 B2
(45) Date of Patent: Oct. 17, 2006

(54) SIGNAL GENERATION SYSTEM AND METHOD FOR GENERATING SIGNALS

(75) Inventor: Scott F Grimshaw, Marcellus, NY (US)

(73) Assignee: Tangidyne Corporation, Marcellus, NY (US)

( * ) Notice: Subject to any disclaimer, the term of this patent is extended or adjusted under 35 U.S.C. 154(b) by 0 days.

(21) Appl. No.: 10/990,895

(22) Filed: Nov. 17, 2004

(65) Prior Publication Data

US 2005/0156738 A1 Jul. 21, 2005

Related U.S. Application Data

(60) Provisional application No. 60/536,858, filed on Jan. 16, 2004.

(51) Int. Cl.
*H01L 41/08* (2006.01)

(52) U.S. Cl. ...................................... 310/339; 310/338

(58) Field of Classification Search ................ 310/319, 310/328, 330–332, 339
See application file for complete search history.

(56) References Cited

U.S. PATENT DOCUMENTS 3,582,692 A * 6/1971 Palini ......................... 310/330
4,114,063 A * 9/1978 Nelkin et al. ............... 310/334
4,538,139 A * 8/1985 Clemente ................. 340/539.3
4,585,970 A * 4/1986 Koal et al. .................. 310/331
4,612,472 A * 9/1986 Kakizaki et al. ............ 310/339
5,258,743 A * 11/1993 Nelson et al. ........... 340/568.1
5,339,051 A * 8/1994 Koehler et al. ............... 331/65
5,554,907 A * 9/1996 Dixon ........................ 310/339
6,407,484 B1 * 6/2002 Oliver et al. ............... 310/339
2005/0073221 A1 4/2005 Albsmeier et al.

FOREIGN PATENT DOCUMENTS

WO 03/041181 A2 5/2003

* cited by examiner

*Primary Examiner*—Mark Budd
(74) *Attorney, Agent, or Firm*—Burr & Brown

(57) ABSTRACT

A signal generation system, comprising a piezoelectric device which, upon actuation, generates voltage, and a wireless transmitter which generates a wireless signal when the piezoelectric device generates the voltage. A signal generation system, comprising signal generating devices, each wireless transmitter generating a respective signal comprising transmission which identifies the wireless transmitter. A signal generation system, comprising signal generating devices, each of the signal generating devices being mounted in or on respective structures which are free to move any distance relative to each other. A method of generating a signal, comprising actuating a piezoelectric device to generate an electrical signal, conveying the signal to a wireless transmitter, and transmitting a wireless transmission. A method of monitoring, comprising actuating piezoelectric devices in signal generating devices to generate respective electric signals, conveying the signals to corresponding wireless transmitters and transmitting corresponding wireless transmissions, each wireless transmission identifying the corresponding piezoelectric device.

23 Claims, 2 Drawing Sheets

SIGNAL GENERATION SYSTEM AND METHOD FOR GENERATING SIGNALS

CROSS-REFERENCE TO RELATED APPLICATIONS

This application claims the benefit of U.S. Provisional Patent Application No. 60/536,858, filed Jan. 16, 2004, the entirety of which is incorporated herein by reference.

FIELD OF THE INVENTION

The present invention is directed to a system for generating a signal, in particular, a system comprising a piezoelectric device which, upon actuation, generates voltage which then causes a wireless transmitter to generate a wireless signal. The present invention is also directed to a method for generating a signal, in particular, a method comprising actuating a piezoelectric device to generate a voltage, and generating a wireless signal using that voltage.

BACKGROUND OF THE INVENTION

A wide variety of signal systems exist which signal the occurrences of various events. For example, signal systems exist which signal the occurrence of a vehicle moving to or from a particular location; a door, window, a latch or other selectively closable structure being opened or closed; a lock, a clasp (such as a seatbelt) or other selectively engageable structure being engaged or disengaged, etc.

Many of such signal systems have one or more limitation or constraint, e.g., they cannot efficiently convey information regarding a large number of structures, the structures cannot be freely moved long distances or relative to each other because the signal systems require electrical connections to power supplies, the signal systems a powered by batteries which require occasional replacement, etc.

For instance, various types of known devices are used for detecting the opening and/or closing of doors, including switch-type, optical-type and infrared type sensors. The use of these monitoring devices has several significant limitations-for example, false alarm rates (e.g., events triggered by exterior motion/vibration or movements caused by wind or thermal warming), as well as these devices being observable by third parties. Another significant limitation shared by these devices, and a downfall of many security and monitoring systems, is their requirement for a continuous power source, typically supplied by connecting to the structure's alternating current power supply or incorporating a battery power source, to transmit or relay information. This limitation restricts the choice and placement of sensors used in a security or monitoring system, as well as requiring routine maintenance, such as battery replacement, and long wiring runs.

It would be a benefit in a wide variety of situations to be able to provide a signal system which overcomes such limitations and constraints, e.g., to be able to mount a signal system on each of a plurality of storage containers (which are, for example, being carried on a ship), each signal system being free from wires connecting to a power source, and each signal system not relying for power on batteries, but being capable of generating a signal upon the occurrence of a specific event, e.g., the container on which the signal system is mounted being opened, or to be able to mount a signal system on each of a plurality of windows and/or doors, each signal system being free from wires connecting to a power source, and each signal system not relying for power on batteries, but being capable of generating a signal upon the occurrence of a specific event, e.g., the window or door on which the signal system is mounted being opened, or to be able to mount a signal system in a plurality of locations in a roadway, each signal system being free from wires connecting to a power source, and each signal system not relying for power on batteries, but being capable of generating a signal upon the occurrence of a specific event, e.g., a vehicle passing over any one of the locations in the roadway where a signal system is located. In addition, it would be a benefit to provide such a system which makes it possible for each signal to identify the particular signal system from which it was generated-for example, where a plurality of signal systems are mounted in respective storage containers, a signal generated by any of the signal systems is unique, such that the signal identifies which one of the storage containers has been opened.

BRIEF SUMMARY OF THE INVENTION

The downfall of many security and monitoring systems is the requirement for power supplies or batteries to relay information. This places a significant limitation on placement of sensors, requires routine maintenance such as battery replacement, requires long wiring runs and also determines the sensor size.

In accordance with a first aspect of the present invention, there is provided a signal generation system, comprising a piezoelectric device and a wireless transmitter. When the piezoelectric device is actuated, it generates voltage. When the piezoelectric device generates a voltage, the wireless transmitter generates a wireless signal.

Preferably, the signal generation system of this aspect of the present invention further comprises a receiver which receives the wireless signal.

The piezoelectric device is mounted at any desired location, e.g., in or on a floor of a building (for example, a home, an office, a warehouse, a deck), in or on a window sill, in or on the earth's surface, in or on a roadway, in or on a vehicle seatbelt, in or on a vehicle trunk, or in or on a vehicle hood.

Preferably, the signal generation system of this aspect of the present invention further comprises a conditioning circuit which receives voltage from the piezoelectric device and which supplies reduced voltage to the wireless transmitter.

Alternatively or additionally, the wireless transmitter is a global positioning system which generates a wireless signal which contains information as to the current global location of the piezoelectric device. A variety of global positioning systems are well known to those of skill in the art, and any such global positioning systems can be used in connection with this aspect of the present invention.

In accordance with a second aspect of the present invention, there is provided a signal generation system, comprising a plurality of signal generating devices, each signal generating device comprising at least one piezoelectric device and at least one wireless transmitter. Each piezoelectric device, when actuated, generates voltage. When the piezoelectric device generates a voltage, the wireless transmitter generates a wireless signal. Each wireless signal comprises transmission which identifies the specific wireless transmitter from which the respective signal was generated.

In accordance with a third aspect of the present invention, there is provided a signal generation system, comprising a plurality of signal generating devices, each signal generating device comprising at least one piezoelectric device and at least one wireless transmitter. When the piezoelectric device is actuated, it generates voltage. When the piezoelectric device generates voltage, the wireless transmitter generates a wireless signal. Each of the signal generating devices is mounted in or on respective structures, the respective structures being free to move any distance relative to each other.

In accordance with a fourth aspect of the present invention, there is provided a method of generating a signal, comprising actuating a piezoelectric device to generate an electrical signal, conveying the signal to a wireless transmitter, and transmitting a wireless transmission from the wireless transmitter when the wireless transmitter receives the signal.

In accordance with a fifth aspect of the present invention, there is provided a method of monitoring, comprising:

actuating piezoelectric devices in a plurality of signal generating devices, each signal generating device comprising a corresponding piezoelectric device which, upon actuation, generates an electric signal, and a corresponding wireless transmitter which generates a wireless transmission when the corresponding piezoelectric device generates a respective electric signal, conveying the electric signals to the corresponding wireless transmitters; and transmitting corresponding wireless transmissions from the corresponding wireless transmitters when the corresponding wireless transmitters receive the respective signals, each corresponding wireless transmission comprising a sequence of at least one pulse which identifies the corresponding piezoelectric device.

The invention may be more fully understood with reference to the accompanying drawings and the following detailed description of the invention.

BRIEF DESCRIPTION OF THE DRAWING FIGURES

DETAILED DESCRIPTION OF THE INVENTION

Figure 1:
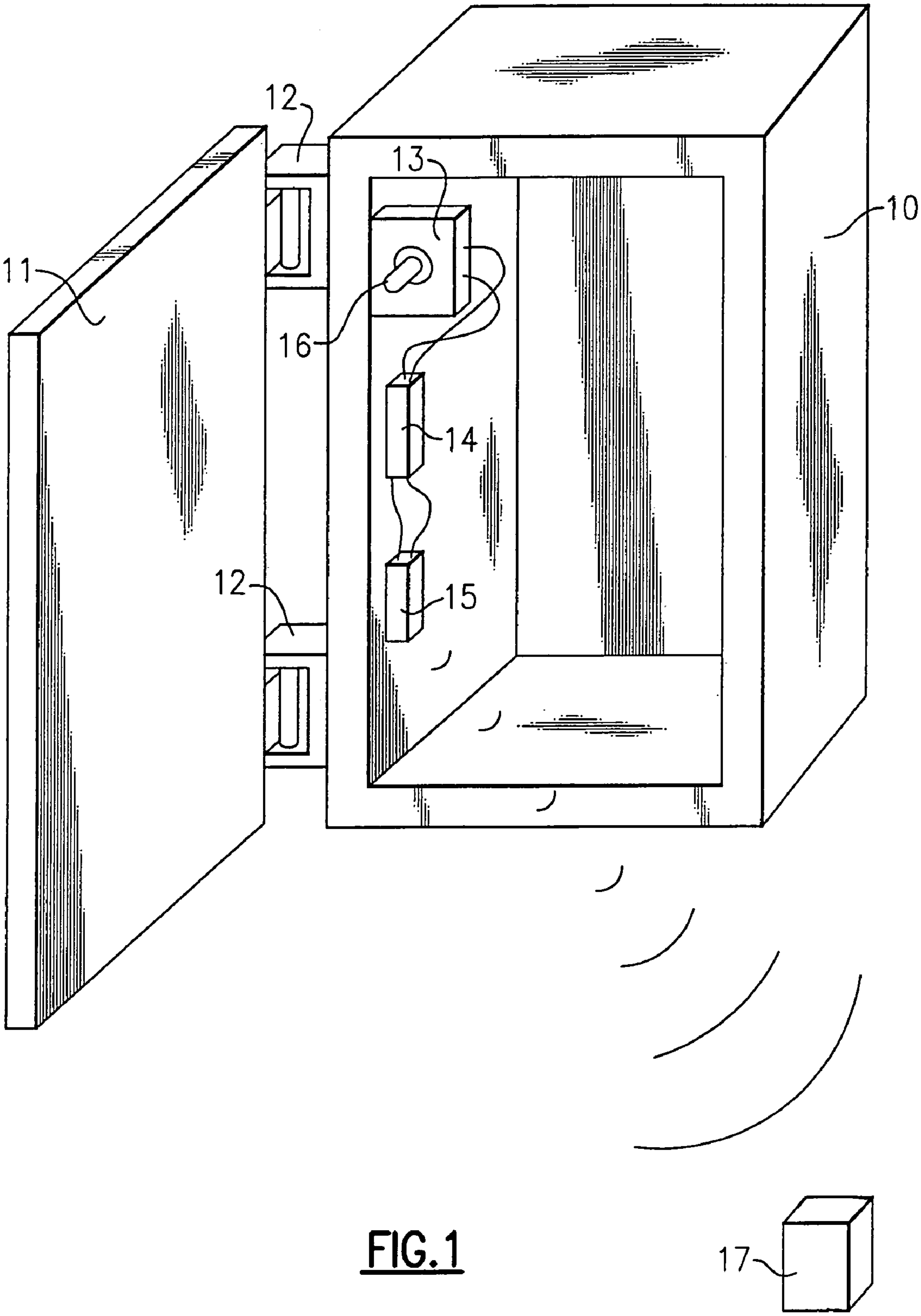
FIG. 1 is a perspective view depicting a first embodiment of a signal generation system in accordance with the present invention.

As mentioned above, the present invention provides a signal generation system, comprising a piezoelectric device and a wireless transmitter. When the piezoelectric device is actuated, it generates voltage, causing the wireless transmitter to generate a wireless signal.

A wide variety of piezoelectric devices which generate voltage when they are actuated are well known to those of skill in the art, and any of such devices can be employed in the systems according to the present invention. For example, high voltage piezoceramic actuators, such as the type commonly used in conventional flame igniters on gas grills can be used.

In a preferred embodiment, the piezoelectric device comprises a housing, a hammer, at least a pair of piezoelectric elements, at least a pair of electrodes, and a mounting bracket, the hammer, the pair of piezoelectric elements, the pair of electrodes, and the mounting bracket being positioned within the housing.

Simply stated, the piezoelectric effect is the production of electrical charge (or voltage) when a material is strained or deformed. Quartz is one of the original piezoelectric materials, and was studied extensively by the Curies in the early 1900's. If one takes a bar of crystalline quartz and distorts it, e.g., by squeezing its ends or stretching it, a measurable voltage will be produced. In this way, quartz converts motion to electrical charge.

In the past 50 years, other materials have been discovered or invented which generate even greater voltages for a given stress. One class of materials, called piezoceramics, are engineered from various oxide powders and pressed into shape. One piezoceramic, PZT, or lead zirconate titanate, develops very large voltages upon deformation. In particular configurations, PZT, when compressed in cylindrical shape, generates in excess of 10,000 Volts for a small change in length (~0.001"). This voltage is large enough to jump across small air gaps, in the form of a spark. As a result, PZT elements can be fashioned into flameless ignition systems for gas grills and furnaces.

Although 10,000 Volts is impressive, it is generally too great a voltage to couple into an electronic circuit for useful work. However, certain circuits can be constructed that store this voltage in a capacitor and reduce the output to a few Volts DC (direct current). This lower level is very compatible with microelectronic circuits used in small radio transmitters.

Engineered or synthetic ceramics, such as PZT, can be used to provide high piezoelectric coefficients and good environmental and temporal stability. The PZT material may be "poled" using a high electric field to force the randomly oriented ceramic material's micro-dipoles into alignment. The positive and negative electrical charges are separated, but symmetrically distributed, so that the ceramic material is electrically neutral. When a stress is applied, this charge symmetry is disturbed, and the resulting charge asymmetry generates a high voltage.

As noted above, the voltage generated by the piezoelectric device is used to cause the wireless transmitter to generate a wireless signal which is received by a receiver.

A wide variety of wireless transmitters and corresponding receivers are well known to those of skill in the art, and any of these can be employed in the present invention. For example, a suitable wireless transmitter can be one which generates an RF (radio-frequency) transmitting device that relays information to a corresponding receiver. The wireless transmitter is not limited to only RF communications and can comprise any communications device able to communicate to a remote location using a low power input signal.

Among currently available RF transmitting devices are devices which are very small in physical size, which operate over a wide range temperature range, and which are capable of transmitting a signal from −40 to 10 dBm of RF power that can be received at distances of as much as 200 meters.

Preferably, the receiver is located in a manned security office in a container transfer facility or in a continuously manned space, e.g., on a merchant ship, such as in the bridge.

In accordance with a preferred aspect of the present invention, the signal generated by the transmitting device can be encoded for each signal generation system (e.g., for each hinge on a plurality of storage containers), giving a unique identifying code. This makes it possible to employ a large number of signal generation systems positioned over an area, and identified by their code. For example, each of a plurality of storage containers could have a signal generation system positioned such that the piezoelectric device for each signal generation system is actuated when the storage container with which such signal generation system is associated, whereby upon actuation of any signal generation system, e.g., by opening on of the storage containers, a unique signal is generated by the signal generation system and received by a receiver. Accordingly, it would be possible to monitor an area and if any of a plurality of storage containers in the area is opened, a signal would be generated which indicates that a storage container has been opened and indicates precisely which container has been opened.

In a preferred aspect of the present invention, a single piezoelectric device can have separate codes based on the polarity of the voltage, such that a single piezoelectric device can give one signal when a door is opened (or any other movable structure is moved in a first way) and a different signal when the door is closed (or any other movable structure is moved in a second way).

Preferably, the encoding described above is achieved using digital encoding, e.g., the sequence 0001 for a first signal generation system, the sequence 0010 for a second signal generation system, the sequence 0011 for a third signal generation system, the sequence 0100 for a fourth signal generation syste, and so on. In such a system, 0 can be encoded as a short pulse and 1 can be encoded as a long pulse. In accordance with a further preferred feature, a processor, e.g., included in a computer system, can be in communication with the receiver and can plot the positions of any tripped actuators; in a further preferred feature, such information can be indexed to a grid in the area being monitored.

In a preferred feature of the present invention, the signal generation system further comprises a key pad which can be used to input a unique identification code for identification of an individual signal generation system.

In accordance with a preferred aspect in accordance with the present invention, the signal generation system includes circuitry which can, if necessary, reduce the voltage, i.e., receive the voltage supplied by the piezoelectric device and supplying a lower voltage to the transmitting device. Preferably, such circuitry is provided by including a conditioning circuit.

For example, where the piezoelectric device produces a voltage which exceeds the voltage desirably supplied to the transmitting device (e.g., where the piezoelectric device produces a voltage in the range of 10,000 volts), the system may include circuitry, e.g., a suitable conditioning circuit, which reduces the voltage to 3 to 5 V DC. Such a voltage can easily power a transmitting device, e.g., an RF (radio-frequency) transmitting device, that relays information to a receiver, giving an indication that the piezoelectric device has been actuated, which indicates that a particular activity has occurred, e.g., a hinge has been moved, a door has been opened, a window has been opened, a vehicle has passed through a location, an object has been moved, etc.

The applications of the signal generation systems of the present invention are numerous. For home or business security use, signal generation systems can be placed anywhere within communication distance of a central receiver. The signal generation systems of the present invention can be mounted in or on any suitable surface, e.g., decks, floors, walls, doors and window sills of buildings, warehouses, homes and other enclosed structures. A wide variety of actuation schemes, including hinges, pushbuttons, plates in a floor, windowsills, gates etc. can be used, based on the mechanics of the actuator body. The piezoelectric device can be mounted in or on a floor of a building, in or on a window sill, in or on the earth's surface, in or on a roadway, in or on a vehicle seatbelt, in or on a vehicle trunk, or in or on a vehicle hood.

The piezoelectric device can be actuated by being compressed, by being stretched, or both by being compressed and by being stretched.

The signal generation systems of the present invention can be used by mounting the piezoelectric device in or on a hinge such that the piezoelectric device is actuated when the hinge is opened, when the hinge is closed, or both when the hinge is opened and when it is closed. For example, doors of cargo containers or truck trailers can have hinges with actuators incorporated therein, such that opening the doors will actuate a piezoelectric device. Similarly, actuators can be employed which will be actuated upon the opening of an automobile seat belt, or the opening of a vehicle hood, trunk or hatch, etc. For instance, a mechanical hinge used to support a door can have a piezoelectric device fastened on one side, such that as the door is opened, one or more piezoelectric elements become compressed or stretched, resulting in a voltage being generated, and a wireless signal in turn being generated. Alternatively, any surface, e.g., roadways (or undeveloped terrain) can have one or more plates embedded in them with one or more actuators bonded to the bottom side of the plates, such that as a truck or car travels over the plate, the plate compresses and drives a piezoelectric actuator, such that a signal is generated. When used as a monitoring system, the present invention can acquire short-term and long-term statistical data on vehicle flow and road usage in an efficient and cost effective manner. The signal generation systems of the present invention can thus be used as alarms, as security systems, as information gathering devices, as monitors, etc. Alternatively, a hinge with a piezoelectric device can be hooked to struts or leaf springs of an automobile, so that whenever there is compression (hitting a bump, for example), energy is created which can drive sensors or recharge a battery.

The signal generation systems of the present invention can be employed on any suitable container. The most common cargo container lengths used in international commerce are 20 ft, 28 ft, 40 ft, and 48 ft. Other containers range from 10 ft to 56 ft in length. The standard width of a container is 8 ft. The height of available containers varies from half height containers of about four feet for some special-purpose applications to high-cube containers being 9 ft 6 in., with the standard container height being 8 ft 6 inches. Containers also come in many configurations including simple boxes with end door only and no insulation; insulated; insulated and equipped with temperature regulating equipment (heating/cooling), containers with adjustable vents for air circulation, as well as special-purpose containers with side doors as well as end doors.

Similarly, signal generation systems according to the present invention can be constructed such that their piezoelectric devices are actuated by pressure being applied to any surface. For instance, the piezoelectric device can include piezoelectric elements which are mounted within a roadway or the earth, and which are compressed when sufficient pressure is applied to the surface, e.g., a vehicle passing over or a person stepping in a particular area.

The signal generation systems according to the present invention likewise can be used with any containment structure having one or more movable structure, the selectively movable structure being movable between a closed position and an open position. In such arrangements, the piezoelectric device can be actuated when the selectively movable structure is moved from the closed position, when the selectively movable structure is moved to the open position, when the selectively movable structure is moved from the open position, and/or when the selectively movable structure is moved to the closed position. For example, the containment structure can be cargo container, and the selectively movable structure can be a door on the containment structure.

Similarly, the signal generation systems according to the present invention can be used on any article comprising at least one movable element, the piezoelectric device being actuated when the movable element is moved into or out of a first position.

Furthermore, in order to make the signal generation system of the present invention more "stealthy", a structure (e.g., a container) can be sealed with a deformable surface with a piezoelectric device incorporated therein, such that when pressure is applied to the deformable surface, the deformable surface with deform and cause the piezoelectric device to actuate. In another "stealthy" aspect, the piezoelectric device can be incorporated into the hinge itself, whereby the signal generation system can be hidden from the outside.

In a further aspect, the signal generation system of the present invention can be positioned on the bottom of a structure (e.g., in pads on its underside), whereby the piezoelectric device of the signal generation system will be actuated if the structure is lifted.

In a further aspect, as noted above, the signal generation system of the present invention can be mounted in a roadway or other surface, such that a structure or vehicle being stored can be place above the signal generation system, whereby a signal will be sent if the structure or vehicle is moved from its storage location.

In addition, there exist piezoelectric devices which are actuated upon tipping (e.g., which include a weight on the end of a cantilevered beam). The signal generation system of the present invention can incorporate such a piezoelectric device such that a signal will be sent if a structure or vehicle in which or on which the piezoelectric device is mounted is tilted, lifted or slid.

In general, any motion can be converted by the piezoelectric device into a signal which can be received.

In accordance with the present invention, it is possible to provide signal generation systems which have very low false alarm rates by employing a piezoelectric device which is actuated only when an "event" causes a significant pressure change (or tension) on the piezoelectric device. For example, piezoelectric devices can be employed which are not easily triggered by minor "events", such as external vibrations associated with shipboard transport of containers. Additionally, the signal generation system can be made in very compact size, allowing installation to be unobtrusive and difficult to detect from outside the container.

In a preferred installation, a mounting bracket is positioned either in close proximity to or within an existing interface between a selectively moveable structure, such as a door, and a fixed or permanent structure of the enclosure being monitored, such that the piezoelectric device is either fully compressed or fully extended when the selectively moveable structure (e.g., door) is in the fully closed position. In such an installation, the throw of the piezoelectric device provides a false alarm buffer zone which allows for some flexing motion of the enclosure's structure without actuating the piezoelectric device. The signal generation systems of the present invention can be mounted on existing interfaces between a selectively moveable structure and a fixed or permanent structure which include, but are not limited to hinged, sliding and/or rotating interfaces.

FIG. 1 depicts a first embodiment of a signal generation system in accordance with the present invention. Referring to FIG. 1, the signal generation system of the first embodiment is mounted on a container 10 having a door 11 (shown in FIG. 1 in an open position) and a pair of hinges 12 rotatably connecting the door 11 to the container 10. The signal generation system in this embodiment includes a piezoelectric device 13 a conditioner circuit 14 and a microelectronic RF transmitter 15 (the conditioner circuit 14 and the transmitter 15 are schematically depicted). The RF transmitter 15 emits an encoded signal when it receives a voltage signal from the conditioner circuit 14. The piezoelectric device 13 in this embodiment is depicted in more detail in FIG. 2.

Figure 2:
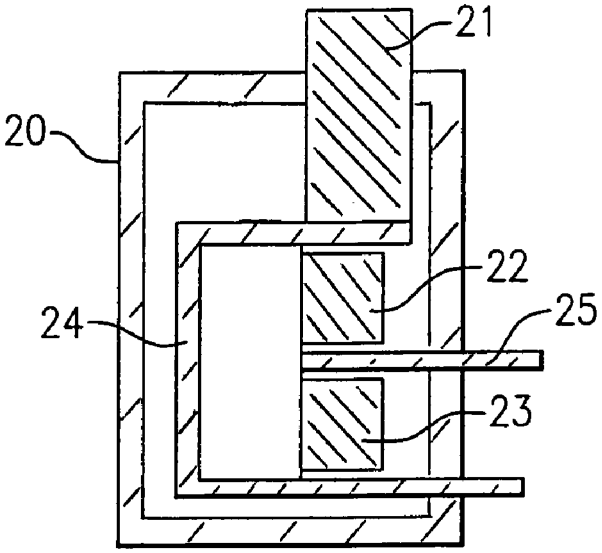
FIG. 2 is a side view depicting the piezoelectric device in the embodiment depicted in FIG. 1.

Referring to FIG. 2, the piezoelectric device 13 of this embodiment includes a housing 20, a hammer 21, a pair of piezoelectric elements 22 and 23 made of PZT, and a pair of electrodes 24 and 25. The pushbutton 16 (see FIG. 1) is spring loaded such that as pressure is applied to it, it builds up potential energy, and when such potential energy exceeds a threshold value, the pushbutton 16 releases and causes the hammer 21 to exert pressure on the piezoelectric elements 22 and 23, generating a high voltage between the electrodes 24 and 25. Such piezoelectric devices are well known in the art, e.g., as flame igniters for gas grills. In this embodiment, the housing 20 provides the interface for mounting the piezoelectric device, and protects the piezoelectric elements 22 and 23 and the internal portions of the electrodes 24 and 25 from impact damage and environmental conditions.

Accordingly, in this embodiment, as the door 11 is closed, it will exert pressure on the pushbutton 16, until the pressure causes the hammer 21 to actuate the piezoelectric elements and generate a high voltage signal between the electrodes 24 and 25, which are connected to the conditioner 14, where the high voltage signal is reduced to a lower voltage which is fed to the transmitter 15, whereby an encoded RF signal is generated, indicating that the door 11 of this specific container 10 has been closed. This RF signal is received by the receiver 17 (schematically depicted in FIG. 1).

Figure 3:
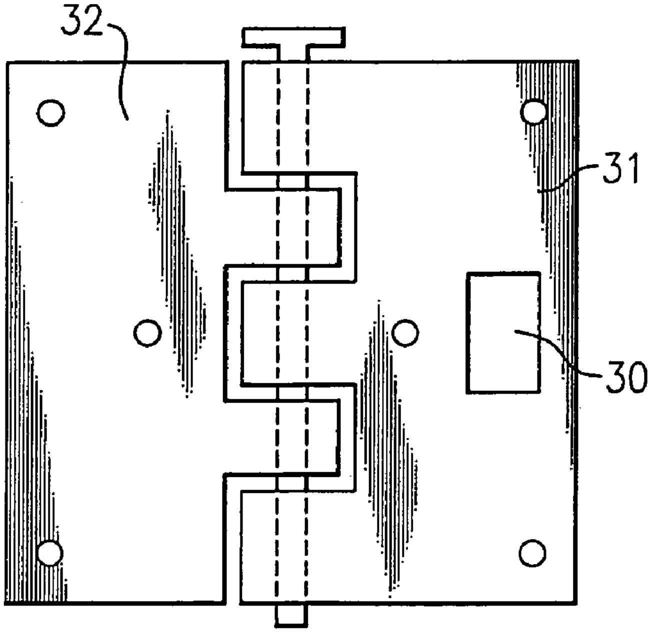
FIG. 3 is a side view depicting a piezoelectric device mounted on one of a pair of hinges in accordance with a further embodiment according to the present invention.

In an analogous manner, a piezoelectric device can be mounted in or on a doorjamb, or in or on a hinge plate (for example, FIG. 3 depicts a piezoelectric device 30 mounted on one of a pair of hinges 31 and 32, in which closure of the hinges brings hinge 32 into contact with the piezoelectric device 30, which protrudes slightly from hing 31, thereby actuating the piezoelectric device 30).

Any two or more structural parts of the signal generation systems described herein can be integrated. Any structural part of the signal generation systems described herein can be provided in two or more parts, which are held together, if necessary. Similarly, any two or more functions can be conducted simultaneously, and/or any function can be conducted in a series of steps.

The invention claimed is:

1. A signal generation system, comprising:

an enclosure having a door, said door being pivotable between a fully open position and a closed position;

at least one piezoelectric device which, upon actuation, generates voltage; and at least one wireless transmitter which generates a wireless signal when said piezoelectric device generates said voltage, said piezoelectric device comprising a spring-loaded pushbutton, a hammer and at least one piezoelectric element, said pushbutton having a first pushbutton position and a second pushbutton position, wherein:

upon moving said door to said closed position, said pushbutton is moved from said first pushbutton position to said second pushbutton position, and upon moving said door away from said closed position, said pushbutton is moved from said second pushbutton position to said first pushbutton position, and said hammer is actuated to exert pressure on said piezoelectric element and thereby actuate said piezoelectric element when said pushbutton is moved from at least one of said first pushbutton position and said second pushbutton position to the other of said first pushbutton position and said second pushbotton position.

2. A signal generation system as recited in claim 1, wherein said wireless transmitter transmits a radio frequency (RF) signal.

3. A signal generation system as recited in claim 1, further comprising a receiver which receives said wireless signal.

4. A signal generation system as recited in claim 1, wherein said receiver is connected to a processor which has the capability to record each signal.

5. A signal generation system as recited in claim 1, wherein each of said piezoelectric elements comprises piezoceramic material.

6. A signal generation system as recited in claim 1, further comprising a conditioning circuit which receives voltage from said piezoelectric device and which supplies reduced voltage to said wireless transmitter.

7. A signal generation system as recited in claim 1, wherein said signal generation system is an alarm system or a security system.

8. A signal generation system as recited in claim 1, wherein said enclosure is a cargo container.

9. A signal generation system as recited in claim 1, wherein said piezoelectric device is mounted in or on a hinge, said piezoelectric device being actuated when said hinge is opened or closed.

10. A signal generation system as recited in claim 1, further comprising at least one hinge, said piezoelectric device being actuated when said hinge is opened or closed.

11. A signal generation system as recited in claim 1, wherein said wireless signal comprises transmission which identifies said wireless transmitter.

12. A signal generation system as recited in claim 1, wherein said wireless transmitter comprises a global positioning system, and said wireless signal comprises transmission which identifies a location of said wireless transmitter.

13. A signal generation system, comprising:

a plurality of enclosures, each said enclosure having at least one door, each said door being pivotable between a closed position and a fully open position;

a plurality of signal generating devices, each signal generating device comprising:

at least one piezoelectric device which, upon actuation, generates voltage; and at least one wireless transmitter which generates a wireless signal when said piezoelectric device generates said voltage, each wireless transmitter generating a respective signal, each respective signal comprising transmission which identifies the specific wireless transmitter from which said respective signal was generated, wherein;

each said signal generating device being mounted on one of said enclosures such that for each enclosure, upon moving at least one door attached to said enclosure away from said closed position or to said closed position, a piqzoelectric device in a signal generating device mounted on said enclosure is actuated and generates a voltage, causing a wireless transmitter in said sinai aenerating device to generate a wireless signal indicating that said enclosure has been manipulated and identifying said enclosure.

14. A signal generation system as recited in claim 13, further comprising a key pad to input a unique identification code for each signal generation system.

15. A signal generation system as recited in claim 13, wherein said respective enclosures are free to move any distance relative to each other.

16. A method of generating a signal, comprising:

moving a door which is pivotably mounted on an enclosure to a closed position or away from a closed position, thereby moving a sprinaloaded pushbutton from a first pushbutton position to a second pushbutton position or from said second pushbutton position to said first pushbutton position, said moving said pushbutton causing a hammer to actuate to exert pressure on a piezoelectric device to generate a signal, said signal being electrical;

conveying said signal to a wireless transmitter; and transmitting a wireless transmission from said wireless transmitter when said wireless transmitter receives said signal.

17. A method as recited in claim 16, further comprising reducing a voltage of said signal before conveying said signal to said wireless transmitter.

18. A method as recited in claim 16, wherein said wireless transmission is a radio frequency (RF) signal.

19. A method as recited in claim 16, further comprising receiving said wireless transmission.

20. A method as recited in claim 16, further comprising recording a plurality of said wireless transmissions in a processor.

21. A method as recited in claim 16, wherein said wireless transmission identifies said piezoelectric device.

22. A method as recited in claim 21, wherein said wireless transmission comprises a sequence of at least one pulse.

23. A method as recited in claim 16, wherein said wireless transmitter comprises a global positioning system, and said wireless transmission comprises transmission which identifies a location of said wireless transmitter.

* * * * *

UNITED STATES PATENT AND TRADEMARK OFFICE

CERTIFICATE OF CORRECTION

PATENT NO. : 7,122,944 B2
APPLICATION NO. : 10/990895
DATED : October 17, 2006
INVENTOR(S) : Scott F. Grimshaw It is certified that error appears in the above-identified patent and that said Letters Patent is hereby corrected as shown below:

Column 10

*Line 13*: please change “piqzoelectric” to --piezoelectric--
*Line 16*: please change “sinar aenerating” to --signal generating--
*Line 28*: please change “sprinaloaded” to --springloaded--

Signed and Sealed this

Thirteenth Day of February, 2007

JON W. DUDAS
*Director of the United States Patent and Trademark Office*